United States Patent [19]

Sato

[11] Patent Number: 5,359,239
[45] Date of Patent: Oct. 25, 1994

[54] OUTPUT CIRCUIT WITH REDUCED SWITCHING NOISE

[75] Inventor: Yasushi Sato, Kawasaki, Japan

[73] Assignee: Kabushiki Kaisha Toshiba, Kawasaki, Japan

[21] Appl. No.: 993,065

[22] Filed: Dec. 18, 1992

[30] Foreign Application Priority Data

Dec. 20, 1991 [JP] Japan .................................. 3-338768

[51] Int. Cl.$^5$ ........................................... H03K 19/20
[52] U.S. Cl. .................................. 307/451; 307/443; 307/594
[58] Field of Search ................. 307/451, 443, 594, 475

[56] References Cited

U.S. PATENT DOCUMENTS

| | | | |
|---|---|---|---|
| 4,725,747 | 2/1988 | Stein et al. | 307/443 |
| 4,789,793 | 12/1988 | Ehni et al. | 307/303 |
| 4,922,676 | 2/1991 | Gerosa | 307/451 |
| 5,081,374 | 1/1992 | Davis | 307/451 |
| 5,099,148 | 3/1992 | McClure | 307/451 |
| 5,111,075 | 5/1992 | Ferry | 307/451 |

Primary Examiner—Edward P. Westin
Assistant Examiner—Andrew Sanders
Attorney, Agent, or Firm—Oblon, Spivak, McClelland, Maier & Neustadt

[57] ABSTRACT

According to this invention, each of a PMOS transistor and an NMOS transistor constituting an output stage has a plurality of gates, the gates of the PMOS and NMOS transistors are independently driven by a plurality of first inverter circuits and a plurality of second inverter circuits having transconductances different from each other. Therefore, all the PMOS and NMOS transistors constituting the output stage can be prevented from being simultaneously rendered conductive.

18 Claims, 7 Drawing Sheets

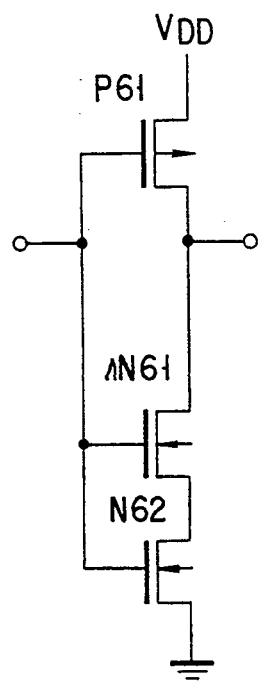
F I G. 9A
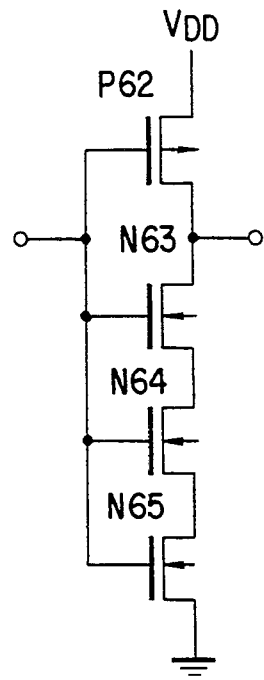
F I G. 9B
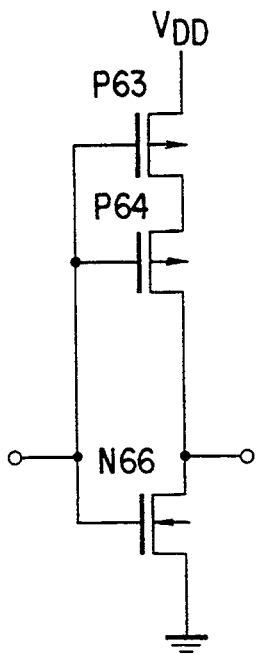
F I G. 10A
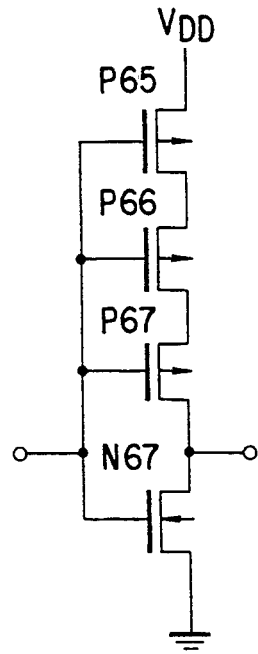
F I G. 10B

OUTPUT CIRCUIT WITH REDUCED SWITCHING NOISE

BACKGROUND OF THE INVENTION

1. Field of the Invention

The present invention relates to a semiconductor integrated circuit and, more particularly, to an output circuit of a semiconductor integrated circuit.

2. Description of the Related Art

In an output circuit of a complementary MOS (CMOS) integrated circuit, an output current is increased with the progress of semiconductor technology and expansion of its application fields.

FIG. 1 is a view showing a conventional output circuit, and FIG. 2 is a view showing an equivalent circuit of the output circuit in FIG. 1.

In FIGS. 1 and 2, an inverter circuit 11 is constituted by a p-channel MOS transistor (to be referred to as a PMOS transistor hereinafter) P1 and an n-channel MOS transistor (to be referred to as an NMOS transistor hereinafter) N1. The gates of the PMOS transistor P1 and the NMOS transistor N1 are connected to an input terminal A, the source of the PMOS transistor P1 is connected to a power supply $V_{DD}$, and the source of the NMOS transistor N1 is grounded.

Both drains B of the PMOS transistor P1 and the NMOS transistor N1 are connected to a gate PG1 of a PMOS transistor P2 and to a gate NG1 of an NMOS transistor N2, respectively, and the PMOS transistor P2 and the NMOS transistor N2 constitute an output stage 12. The gates PG1 and NG1 are meandered. A plurality of sources PS2 and a plurality of drains PD2 of the PMOS transistor P2 are arranged adjacent to the gate PG1, and a plurality of sources NS2 and a plurality of drains ND2 of the NMOS transistor N2 are arranged adjacent to the gate NG1. The sources PS2 of the PMOS transistor P2 are connected to the power supply $V_{DD}$, and the sources NS2 of the NMOS transistor N2 are grounded. The drains PD2 of the PMOS transistor P2 and the drains ND2 of the NMOS transistor N2 are connected to an output terminal C.

In the above conventional output circuit, the PMOS transistor P2 and the NMOS transistor N2 which constitute the output stage 12 have a larger current driving capacity than that of the PMOS transistor P1 and the NMOS transistor N1 which constitute the inverter circuit 11. Therefore, when an output signal level is switched, since a large current is supplied to the PMOS transistor P2 or the NMOS transistor N2 within a short time, large noise is generated by the output terminal C.

The same signal is supplied to the PMOS transistor P2 and the NMOS transistor N2 which constitute the output stage 12. For this reason, when the output signal level is to be switched, these transistors are simultaneously rendered conductive. Therefore, power consumption of the output circuit is increased.

Prior arts of the present invention are filed in U.S. Pat. Nos. 4,725,747 and 4,789,793.

SUMMARY OF THE INVENTION

It is an object of the present invention to provide an output circuit capable of preventing a plurality of transistors constituting an output stage from being simultaneously rendered conductive, and preventing an increase in current consumption caused by a large amount of current and generation of noise.

In order to solve the above problems, an output circuit according to the present invention is characterized by comprising a first power supply; a MOS transistor of a first conductivity type having one terminal connected to the first power supply, the other terminal connected to the output terminal, and a plurality of gates; a second power supply; a MOS transistor of a second conductivity type having one terminal connected to the output terminal, the other terminal connected to the second power supply, and a plurality of gates; a plurality of first inverter circuits, arranged in correspondence with the plurality of gates of the MOS transistor of the first conductivity type and respectively connected to the plurality of gates of the MOS transistor of the first conductivity type, for independently driving the plurality of gates of the MOS transistor of the first conductivity type in response to input signals input to the input terminal; and a plurality of second inverter circuits, arranged in correspondence with the plurality of gates of the MOS transistor of the second conductivity type and respectively connected to the plurality of gates of the MOS transistor of the second conductivity type, for independently driving the plurality of gates of the MOS transistor of the second conductivity type in response to the input signals input to the input terminal.

In the above output circuit, at least the plurality of first inverter circuits or the plurality of second inverter circuits are characterized by having transconductances different from each other, and the transconductances are set such that fall or rise times of output signals output from the output terminal in response to the input signals are different from each other.

In addition, the output circuit of the present invention is characterized by comprising a first power supply; a MOS transistor of a first conductivity type having one terminal connected to the first power supply, the other terminal connected to the output terminal, and a plurality of gates; a second power supply; a MOS transistor of a second conductivity type having one terminal connected to the output terminal, the other terminal connected to the second power supply, and a plurality of gates; a plurality of first gate circuits, arranged in correspondence with the plurality of gates of the MOS transistor of the first conductivity type and respectively connected to the plurality of gates of the MOS transistor of the first conductivity type, for independently driving the plurality of gates of the MOS transistor of the first conductivity type in response to a first input signal input to the first input terminal and a second input signal input to the second input terminal; and a plurality of second gate circuits, arranged in correspondence with the plurality of gates of the MOS transistor of the second conductivity type and respectively connected to the plurality of gates of the MOS transistor of the second conductivity type, for independently driving the plurality of gates of the MOS transistor of the second conductivity type in response to the first input signal input to the first input terminal and a third input signal input to the third input terminal and serving as an inverted signal of the second input signal.

The plurality of first gate circuits are characterized in that the first gate circuits are respectively constituted by NAND circuits having transconductances different from each other, and the transconductances are set such that fall times of output signals output from the output terminal in response to the first and second input signals are different from each other.

The plurality of second gate circuits are characterized in that the second gate circuits are respectively constituted by NOR circuits, having transconductances different from each other, and the transconductances are set such that rise times of output signals output from the output terminal in response to the first and third input signals are different from each other.

According to the present invention, each of a MOS transistor of a first conductivity type and a MOS transistor of a second conductivity type which constitute an output stage has a plurality of gates. These plurality of gates of the MOS transistor of the first conductivity type are independently driven by the plurality of first inverter circuits or the plurality of first gate circuits, and the plurality of gates of the MOS transistor of the second conductivity type are independently driven by the plurality of second inverter circuits or the plurality of second gate circuits. Therefore, all of the MOS transistor of the first conductivity type and the MOS transistor of the second conductivity type which constitute the output stage are prevented from being simultaneously rendered conductive, and an increase in current consumption caused by a large amount of current and generation of noise can be prevented.

As described above, according to the present invention, there can be provided an output circuit capable of preventing all the transistors constituting the output stage from being simultaneously rendered conductive and preventing an increase in current consumption caused by a large amount of current and generation of noise.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

Figure 1:
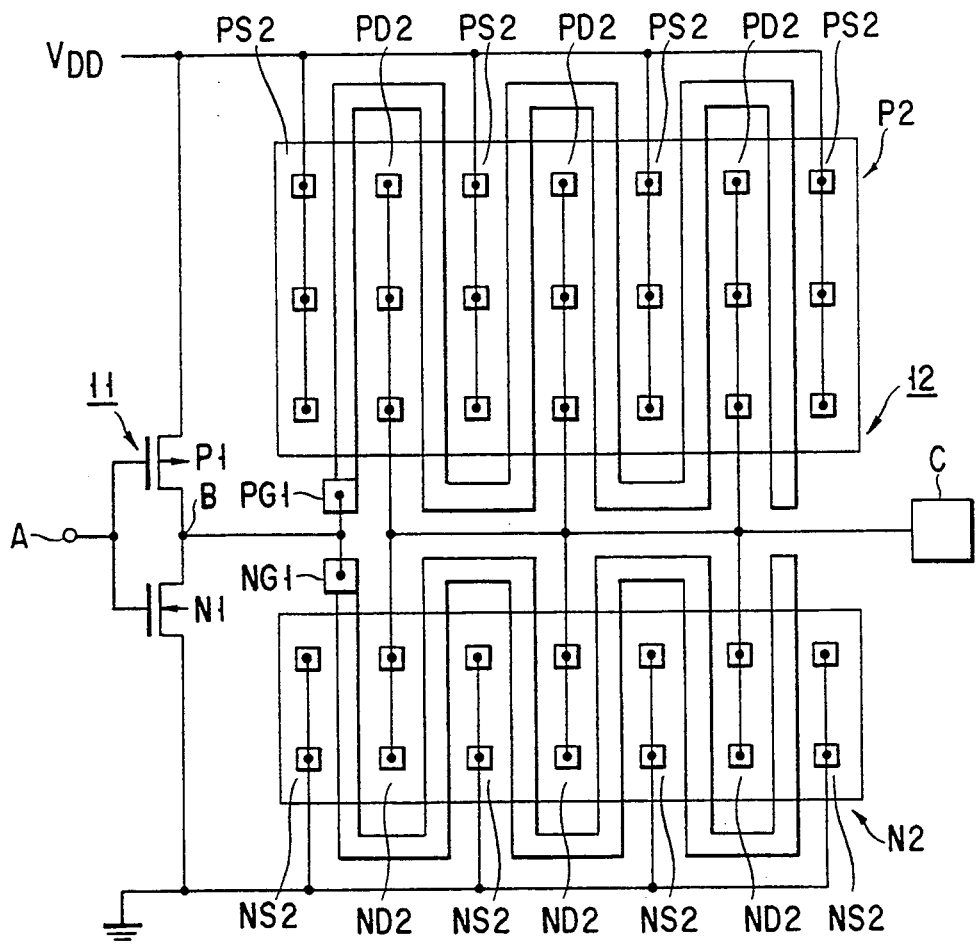
FIG. 1 is a circuit diagram showing a conventional output circuit.
Figure 2:
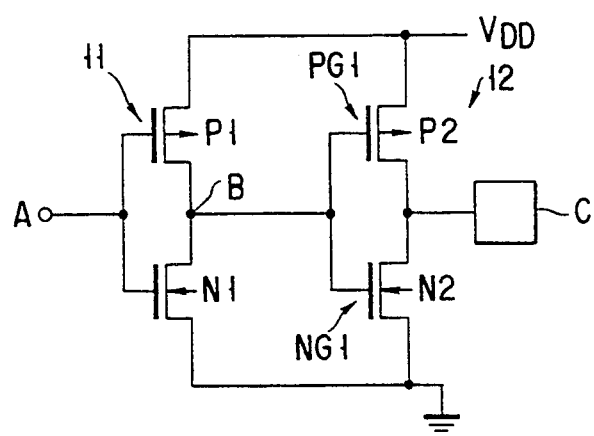
FIG. 2 is a circuit diagram showing an equivalent circuit of the output circuit in FIG. 1.
Figure 3:
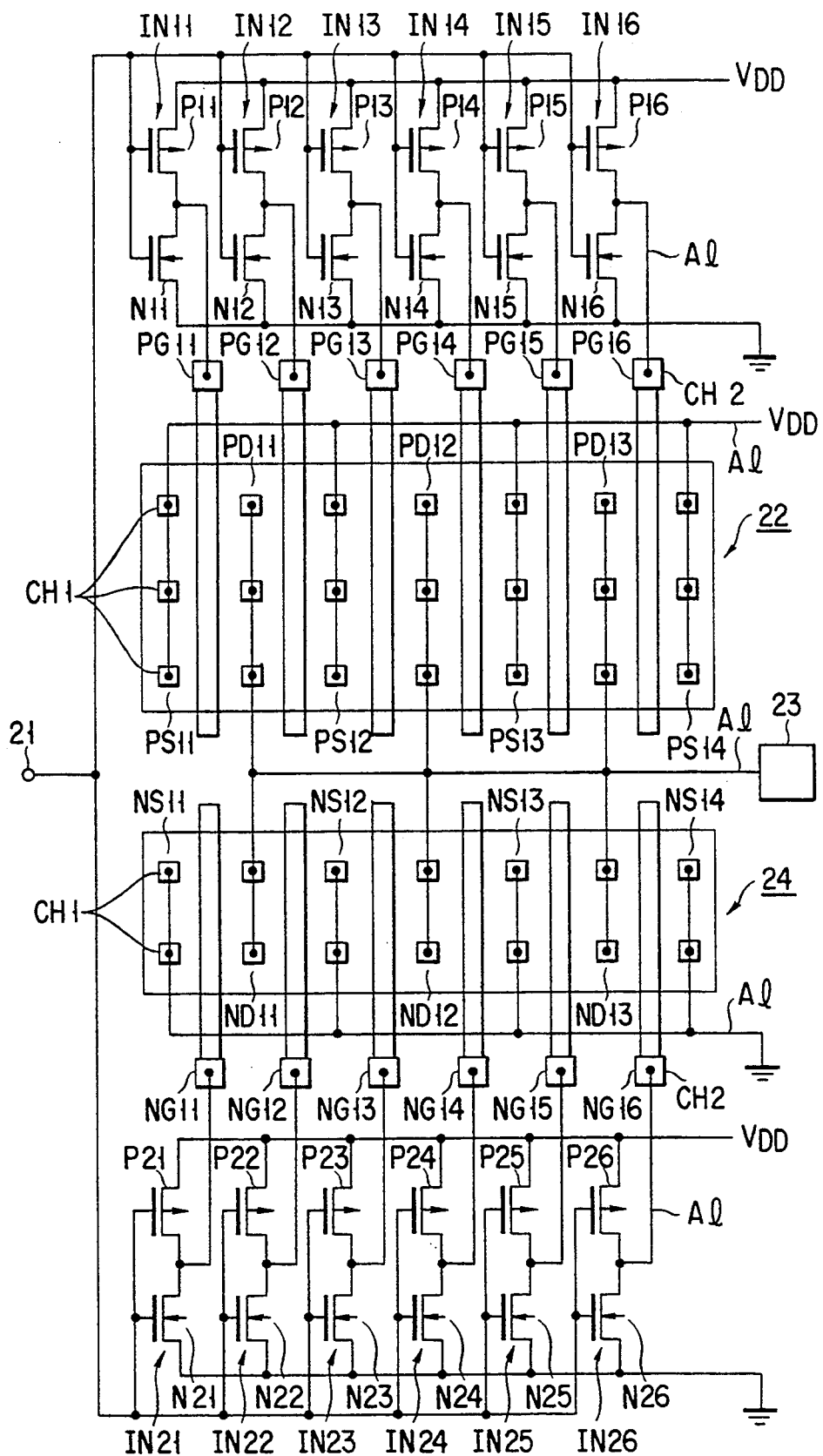
FIG. 3 is a circuit diagram showing the first embodiment of the present invention.

FIGS. 9A and 9B are circuit diagrams showing another embodiment of the inverter circuits IN11 to IN16 shown in FIG. 3; and FIGS. 10A and 10B are circuit diagrams showing another embodiment of the inverter circuits IN21 to IN26 shown in FIG. 3.

DETAILED DESCRIPTION OF THE PREFERRED EMBODIMENTS

An embodiment of the present invention will be described below with reference to the accompanying drawings.

FIG. 3 is a circuit diagram showing the first embodiment of the present invention.

In FIG. 3, a signal input terminal 21 is connected to the gates of PMOS transistors P11 to P16 and P21 to P26 and NMOS transistors N11 to N16 and N21 to N26. Inverter circuits IN11 to IN16 each having a CMOS structure are constituted by the PMOS transistors P11 to P16 and the NMOS transistors N11 to N16, respectively, and inverter circuits IN21 to IN26 each having a CMOS structure are constituted by the PMOS transistors P21 to P26 and the NMOS transistors N21 to N26, respectively. The sources of the PMOS transistors P11 to P16 and P21 to P26 are connected to a power supply $V_{DD}$. The drains of the PMOS transistors P11 to P16 and P21 to P26 are connected to the drains of the NMOS transistors N11 to N16 and N21 to N26, respectively. The sources of the NMOS transistors N11 to N16 and N21 to N26 are grounded.

The output terminals of the inverter circuits IN11 to IN16, i.e., the drains of the PMOS transistors P11 to P16 and the NMOS transistors N11 to N16 are connected to the gates PG11 to PG16 of a PMOS transistor 22 constituting an output stage, respectively. The PMOS transistor 22 has a plurality of gates, and these plurality of gates PG11 to PG16 are independently controlled by the inverter circuits IN11 to IN16, respectively. Sources PS11 to PS14 arranged adjacent to the gates PG11 to PG16 of the PMOS transistor 22 are connected to the power supply $V_{DD}$, and drains PD21 to PD13 of the PMOS transistor 22 are connected to an output terminal 23 constituting a bonding pad of an integrated circuit.

The output terminals of the inverters IN21 to IN26, i.e., the drains of the PMOS transistors P21 to P26 and the NMOS transistors N21 to N26 are connected to gates NG11 to NG16 of an NMOS transistor 24 constituting an output stage, respectively. The NMOS transistor 24 has a plurality of gates, and the plurality of gates NG11 to NG16 are independently controlled by the inverter circuits IN21 to IN26, respectively. Sources NS11 to NS14 arranged adjacent to the gates NG11 to NG16 of the NMOS transistor 24 are grounded, and drains ND11 to ND13 of the NMOS transistor 24 are connected to the output terminal 23.

The sources PS11 to PS14 of the PMOS transistor 22 of the output stage, the sources NS11 to NS14 of the NMOS transistor 24 of the output stage, the drains PD11 to PD13 of the PMOS transistor 22, and the drains ND11 to ND13 of the NMOS transistor 24 are generally constituted by diffusion layers, respectively. These sources and drains are connected to a metal material, e.g., an aluminum wiring layer A1 through a plurality of contact holes CH1, and are connected to the power supply $V_{DD}$ or the ground potential through the aluminum wiring layers A1.

As a gate material, a metal or polysilicon is used. In this embodiment, the polysilicon is used. The polysilicon serving as the gate material is connected to the aluminum wiring layer A1 through a plurality of contact holes CH2.

FIGS. 4A to 4F and FIGS. 5A to 5F are views respective showing the channel widths and the channel lengths of transistors constituting the inverter circuits IN11 to IN16 and IN21 to IN26.

Figure 4A:
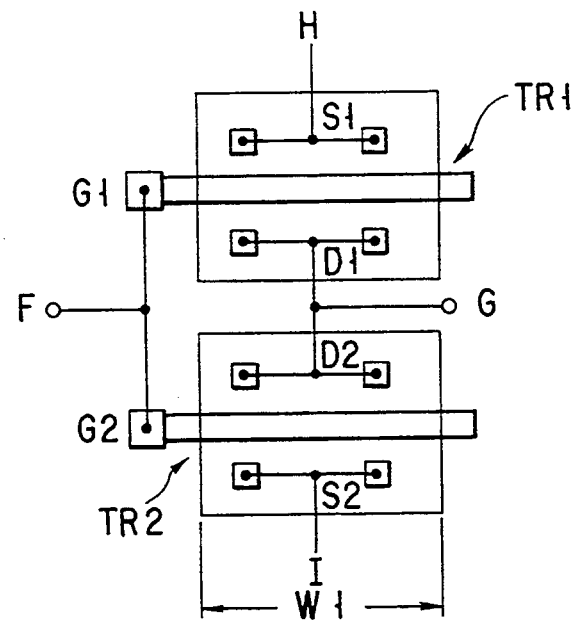
FIGS. 4A to 4F are views showing the channel widths of the transistors constituting the inverter circuits shown in FIG. 3.
Figure 4B:
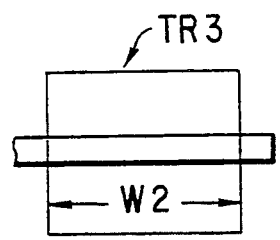
Figure 4C:
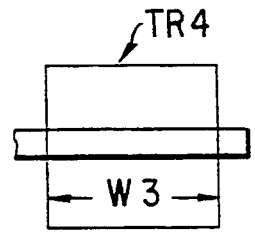
Figure 4D:
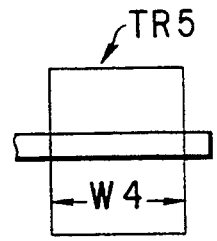
Figure 4E:
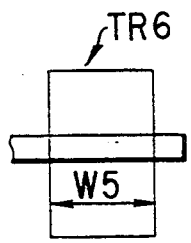
Figure 4F:
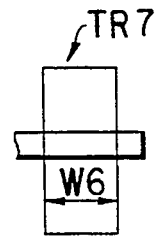

In FIGS. 4A to 4F, reference symbols TR1, TR2, TR3, TR4, TR5, TR6, and TR7 denote the arrangements of PMOS or NMOS transistors. Each of the channel widths of the transistors TR1 and TR2 shown in FIG. 4A is W1. FIG. 4A shows a case wherein an inverter circuit is constituted by the transistors TR1 and TR2.

The transistors TR3, TR4, TR5, TR6, and TR7 shown in FIGS. 4B to 4F have channel widths W2, W3, W4, W5 and W6, respectively, and the channel widths are sequentially decreased in this order. That is, the channel widths satisfy a condition $W1 > W2 > W3 > W4 > W5 > W6$.

The PMOS transistor P11 of the inverter circuit IN11 shown in FIG. 3 is constituted by the transistor TR1 shown in FIG. 4A, and the NMOS transistor N11 is constituted by the transistor TR2 shown in FIG. 4A. Each of the PMOS transistors P12, P13, P14, P15, and P16 of the inverter circuits IN12, IN13, IN14, IN15, and IN16 is constituted by the transistor TR1 shown in FIG. 4A. The NMOS transistors N12, N13, N14, N15, and N16 are constituted by the transistors TR3, TR4, TR5, TR6, and TR7 shown FIGS. 4B to 4F, respectively.

In contrast to this, in the inverter circuits IN21 to IN26 shown in FIG. 3, each of the NMOS transistors N21 to N26 is constituted by the transistor TR1 shown in FIG. 4A, and the PMOS transistor P21 is constituted by the transistor TR2. The PMOS transistors P22, P23, P24, P25 and P26 are constituted by the transistors TR3, TR4, TR5, TR6, and TR7 shown in FIGS. 4B to 4F, respectively.

Figure 5A:
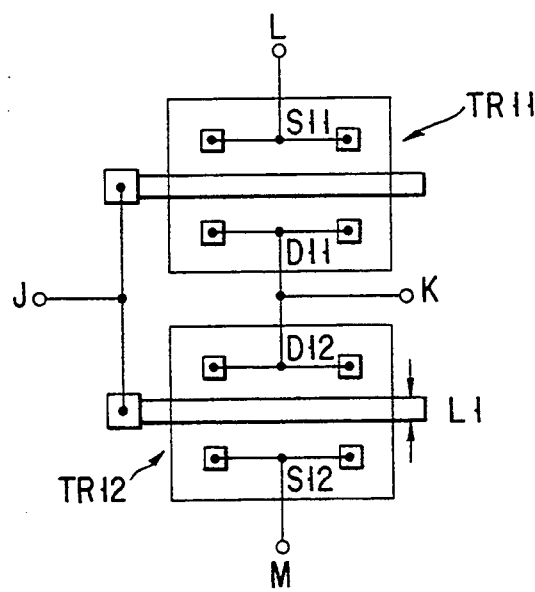
FIGS. 5A to 5F are views showing the channel lengths of the transistors constituting the inverter circuits shown in FIG. 3.
Figure 5B:
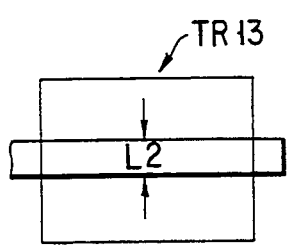
Figure 5C:
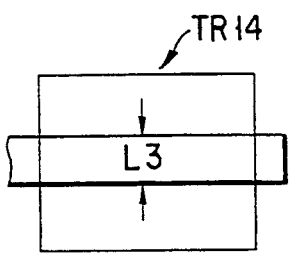
Figure 5D:
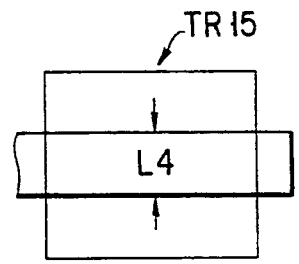
Figure 5E:
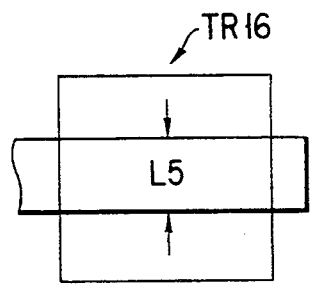
Figure 5F:
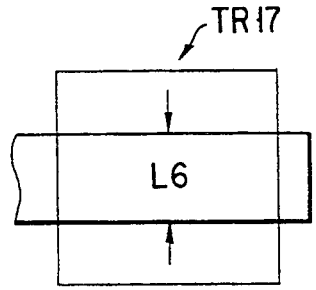

Unlike FIGS. 4A to 4F, FIGS. 5A to 5F show transistors having different channel lengths. In FIGS. 5A to 5F, transistors TR11 to TR17 denote the arrangements of PMOS or NMOS transistors. Each of the channel lengths of the transistors TR11 and TR12 shown in FIG. 5A is L1. FIG. 5A shows a case wherein an inverter circuit is constituted by the transistors TR11 and TR12.

The transistors TR13, TR14, TR15, TR16, and TR17 shown in FIGS. 5B to 5F have channel lengths L2 to L6, respectively, and the channel lengths L2 to L6 are sequentially increased in this order. That is, the channel lengths satisfy a condition $L1 < L2 < L3 < L4 < L5 < L6$.

When the inverter circuits IN11 to IN16 shown in FIG. 3 are constituted by the transistors shown in FIGS. 5A to 5F, each of the PMOS transistors P11 to P16 is constituted by the transistor TR11 shown in FIG. 5A. The NMOS transistor N11 is constituted by the transistor TR12, and the NMOS transistors N12 to N16 are constituted by the transistors TR13 to TR17 shown in FIGS. 5B to 5F, respectively.

In contrast to this, when the inverter circuits IN21 to IN26 shown in FIG. 3 are constituted, each of the NMOS transistors N21 to N26 is constituted by the transistor TR11 shown in FIG. 5A. The PMOS transistor P21 is constituted by the transistor TR12, and the PMOS transistors P22 to P26 are constituted by the transistors TR13 to TR17 shown in FIGS. 5B to 5F, respectively.

An operation of the output circuit of this embodiment arranged as described above will be described below.

The transconductance of a MOS transistor is in proportion to the driving power of the MOS transistor. That is, when the same load is driven, in a PMOS transistor, a rise time becomes short as a transconductance is increased, and in contrast to this, the rise time becomes long as the transconductance is decreased.

In an NMOS transistor, a fall time becomes short as a transconductance is increased, and in contrast to this, the fall time becomes long as the transconductance is decreased.

The transconductance of a MOS transistor is in proportion to the channel width (W) of the MOS transistor, and is in inverse proportion to the channel length (L) of the MOS transistor. Therefore, when the channel widths W are changed as shown in FIGS. 4A to 4F, driving powers become low as the channel widths W are decreased. For this reason, when each of the transistors of an output stage has the same gate capacitance, the rise times or fall times of the transistors are prolonged.

Figure 6A:
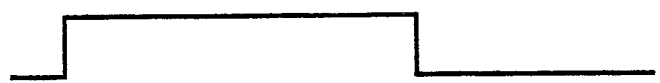
FIGS. 6A to 6M are waveform charts for explaining the operation of the output circuit in FIG. 3.
Figure 6B:
Figure 6C:
Figure 6D:
Figure 6E:
Figure 6F:
Figure 6G:
Figure 6H:
Figure 6I:
Figure 6J:
Figure 6K:
Figure 6L:
Figure 6M:

FIG. 6A shows the input waveform of the input terminal 21 in FIG. 3, and FIGS. 6B to 6M show the output waveforms of the inverter circuits in FIG. 3, respectively. When the signal in FIG. 6A is supplied to the input terminal 21, the output signals of the inverter circuits IN11 to IN16 have the waveforms shown in FIGS. 6B to 6G, respectively, and the output signals of the inverter circuits IN21 to IN26 have the waveforms shown in FIGS. 6H to 6M, respectively.

As shown in FIGS. 6A to 6M, the PMOS transistor 22 and the NMOS transistor 24 of the output stage in FIG. 3 are gradually rendered conductive, and are abruptly turned off. As a result, all the PMOS transistor 22 and the NMOS transistor 24 of the output stage are not simultaneously rendered conductive. For this reason, noise generated by causing excessive currents to flow in the PMOS transistor 22 and the NMOS transistor 24 can be reduced, and power consumption can be reduced because a through current is small.

As shown in FIGS. 5A to 5F, even when transconductances are changed by changing the channel lengths (L) of transistors, the rise times and fall times of the output signals from the inverters IN11 to IN26 can be changed as described above. Therefore, the same effect as that obtained when the channel widths w of the transistors are changed can be obtained.

Figure 7:
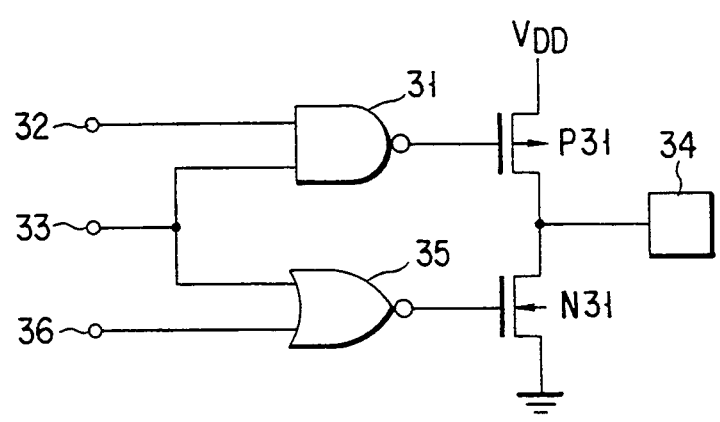
FIG. 7 is a circuit diagram showing an equivalent circuit of a conventional output circuit to which the present invention can be applied.

FIG. 7 shows a conventional output circuit to which the present invention can be applied.

In FIG. 7, one input terminal of a NAND gate 31 is connected to an input terminal 32, and the other input terminal is connected to an input terminal 33. The output terminal of the NAND circuit 31 is connected to the gate of a PMOS transistor P31 constituting an output stage. The source of the PMOS transistor P31 is connected to a power supply $V_{DD}$, and the drain of the PMOS transistor P31 is connected to an output terminal 34 and the drain of an NMOS transistor N31. The source of the NMOS transistor N31 is grounded.

One input terminal of a NOR circuit 35 is connected to the input terminal 33, and the other input terminal thereof is connected to an input terminal 36. The output terminal of the NOR circuit 35 is connected to the gate of the NMOS transistor N31 constituting the output stage.

In the output circuit arranged as described above, the output terminal 34 has a high impedance when signals "0" and "1" are input to the input terminals 32 and 36, respectively. In this case, a NOT circuit (not shown) may be arranged between the input terminals 32 and 36.

Figure 8:
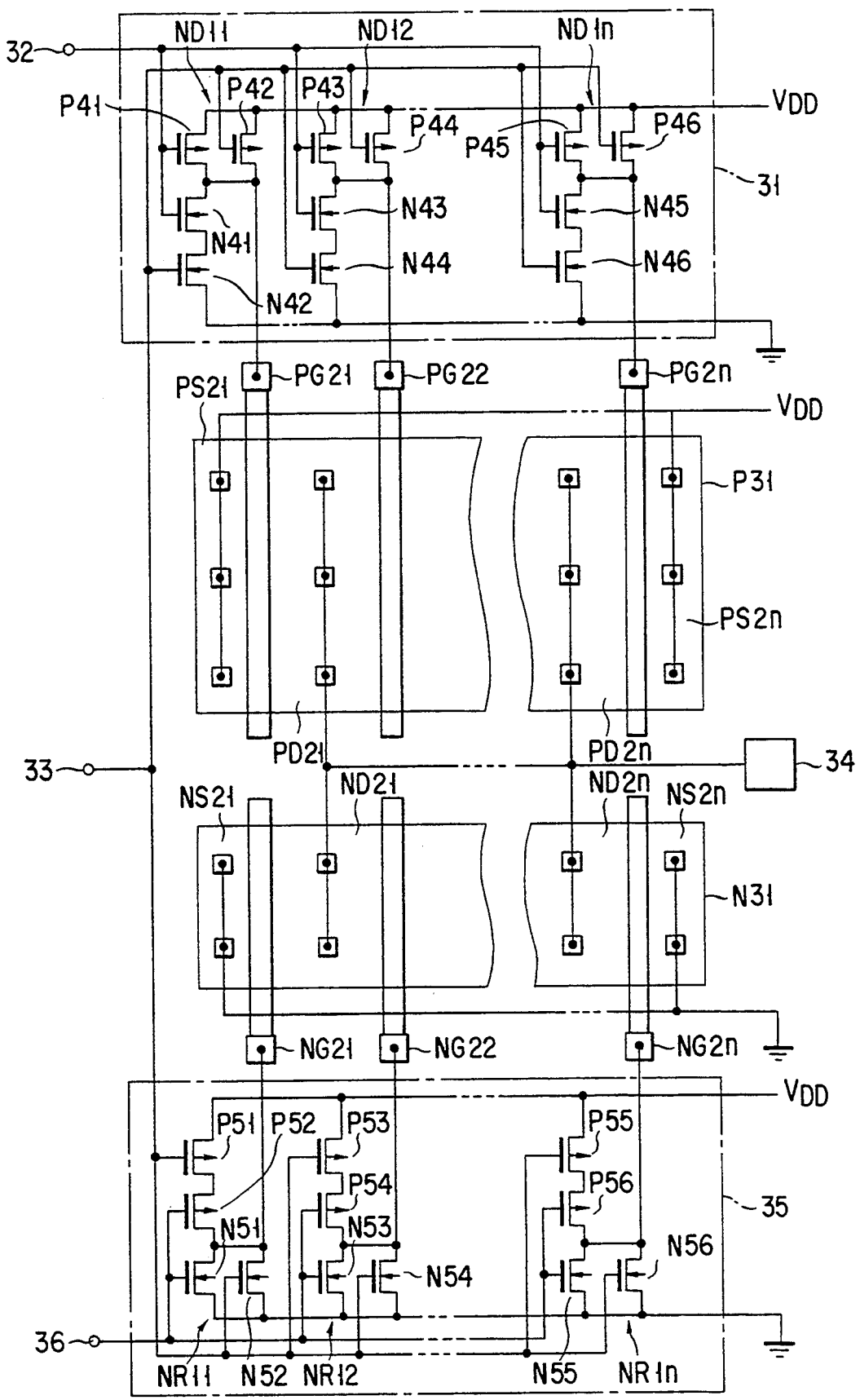
FIG. 8 is a view showing a circuit obtained by applying the present invention to the circuit shown in FIG. 7 according to the second embodiment of the present invention.

FIG. 8 shows the second embodiment of the present invention and is a circuit diagram showing the second embodiment in which the present invention is applied to the output circuit shown in FIG. 7. The same reference numerals as in FIG. 7 denote the same parts in FIG. 8.

A NAND circuit 31 is constituted by a plurality of NAND circuits ND11, ND12, ..., ND1n.

An input terminal 32 is connected to the gates of PMOS transistors P41, P43, and P45 and NMOS transistors N41, N43, and N45. The PMOS transistors P41, P43, ..., P45 and the NMOS transistors N41, N43, ..., N45 constitute the NAND circuits ND11, ND12, ..., ND1n, respectively.

The sources of the PMOS transistors P41, P43, and P45 are connected to a power supply $V_{DD}$, and the drains of the PMOS transistors P41, P43, and P45 are connected to the drains of the NMOS transistors N41, N43, and N45, respectively. The drains of NMOS transistors N42, N44, and N46 are connected to the sources of the NMOS transistors N41, N43, and N45, respectively, and the sources of the NMOS transistors N42, N44, and N46 are grounded. The gates of the NMOS transistors N42, N44, and N46 are connected to an input terminal 33. The sources and drains of PMOS transistors P42, P44, and P46 are connected to the sources and drains of the PMOS transistors P41, P43, and P45, respectively, and the gates of the PMOS transistors P42, P44, and P46 are connected to the input terminal 33.

The output terminals of the plurality of NAND circuits ND11, ND12 to ND1n, i.e., the drains of the PMOS transistors P41 and P42, the drains of the PMOS transistors P43 and P44, and the drains of the PMOS transistors P45 and P46 are connected to a plurality of gates PG21, PG22 to PG2n of a PMOS transistor P31 constituting an output stage, respectively. Sources PS21 to PS2n of the PMOS transistor P31 are connected to the power supply $V_{DD}$, and drains PD21 to PD2n of the PMOS transistor P31 are connected to an output terminal 34.

On the other hand, a NOR circuit 35 is constituted by a plurality of NOR circuits NR11, NR12 to NR1n. An input terminal 36 is connected to the gates of NMOS transistors N51, N53, and N55 and PMOS transistors P52, P54, and P56. The NMOS transistors N51, N53, ..., N55 and the PMOS transistors P52, P54, ..., P56 constitute the NOR circuits NR11, NR12, ..., NR1n, respectively. The sources of the NMOS transistors N51, N53, and N55 are grounded, and the drains of the NMOS transistors N51, N53, and N55 are connected to the drains of the PMOS transistors P52, P54, and P56, respectively. The sources of the PMOS transistors P52, P54, and P56 are connected to the drains of PMOS transistors P51, P53, and P55, respectively. The sources of the PMOS transistors P51, P53, and P55 are connected to the power supply $V_{DD}$, and gates of the PMOS transistors P51, P53, and P55 are connected to the input terminal 33. The sources and drains of NMOS transistors N52, N54, and N56 are connected to the sources and drains of the NMOS transistors N51, N53, and N55, respectively, and the gates of the NMOS transistors N52, N54, and N56 are connected to the input terminal 33.

The output terminals of the NOR circuits NR11, NR12 to NR1n, i.e., the drains of the NMOS transistors N51 and N52, the drains of the NMOS transistors N53 and N54, and the drains of the NMOS transistors N55 and N56 are connected to a plurality of gates NG21, NG22 to NG2n of an NMOS transistor N31 constituting an output stage, respectively. Sources NS21 to NS2n of the NMOS transistor N31 are grounded, and drains ND21 to ND2n of the NMOS transistor N31 are connected to the output terminal 34.

With the above arrangement, the PMOS transistors P41 to P46 constituting the NAND circuits ND11 to ND1n have high transconductances enough to shorten the rise times of the PMOS transistors such that the PMOS transistor of the output stage is abruptly turned off.

The NMOS transistors N41 to N46 constituting the NAND circuits ND11 to ND1n are constituted such that the PMOS transistor P31 of the output stage is gradually rendered conductive. That is, the NMOS transistors N41 and N42 are paired, the NMOS transistors N43 and N44 are paired, and the NMOS transistors N45 and N46 are paired. The transconductance of one of the paired transistors or the transconductances of both the paired transistors are changed to change the fall times of the corresponding transistors.

On the other hand, the NMOS transistors N51 to N56 constituting the NOR circuits NR11 to NR1n have high transconductances enough to shorten the fall times of the NMOS transistors such that the NMOS transistor N31 of the output stage is abruptly turned off.

The PMOS transistors P51 to P56 constituting the NOR circuits NR11 to NR1n are constituted such that the NMOS transistor N31 of the output stage is gradually rendered conductive. That is, the PMOS transistors P51 and P52 are paired, the PMOS transistors P53 and P54 are paired, and the PMOS transistors P55 and P56 are paired. The transconductance of one of the paired transistors or the transconductance of both the paired transistors are changed to change the rise time of the corresponding transistor.

With the above arrangement, the signal waveforms of the plurality of gate terminals PG21 to PG2n and NG21 to NG2n of the output stage in FIG. 8 can be set to be equal to those in FIGS. 6B to 6M as in the first embodiment. Therefore, the same effect as in the first embodiment can be obtained in the second embodiment.

FIGS. 9A and 9B show another embodiment of the inverter circuits IN11 to IN16 shown in FIG. 3.

FIG. 9A shows an inverter circuit obtained by connecting two NMOS transistors N61 and N62 in series with one PMOS transistor P61. Input signals are supplied to the gates of the PMOS transistor P61 and the NMOS transistors N61 and N62, and signals are output from the drains of the PMOS transistor P61 and the NMOS transistor N61.

FIG. 9B shows an inverter circuit obtained by connecting three NMOS transistors N63, N64, and N65 in series with one PMOS transistor P62. Input signals are supplied to the gates of the PMOS transistor P62 and the NMOS transistors N63, N64, and N65, and signals are output from the drains of the PMOS transistor P62 and the NMOS transistor N63.

FIGS. 10A and 10B show another embodiment of the inverter circuits IN21 to IN26 shown in FIG. 3.

FIG. 10A shows an inverter circuit obtained by connecting one NMOS transistor N66 in series with two PMOS transistors P63 and P64. Input signals are supplied to the gates of the PMOS transistors P63 and P64 and the NMOS transistor N66, and signals are output from the drains of the PMOS transistor P64 and the NMOS transistor N66.

FIG. 10B shows an inverter circuit obtained by connecting one NMOS transistor N67 in series with three PMOS transistors P65, P66, and P67. Input signals are supplied to the gates of the NMOS transistor N67 and the PMOS transistors P65, P66, and P67, and signals are output from the drains of the PMOS transistor P67 and the NMOS transistor N67.

When the inverter circuits shown in FIGS. 9A, 9B, 10A, and 10B are used in place of the inverter circuits IN11 to IN16 and IN21 to IN26 shown in FIG. 3, the transconductances can be equivalently changed. Therefore, the same effect as in the first embodiment can be obtained.

The present invention is not limited to the above embodiments, and various changes and modifications may be effected without departing from the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An output circuit having an output terminal and an input terminal, comprising:
    a first power supply;
    a MOS transistor of a first conductivity type having one terminal connected to said first power supply, the other terminal connected to said output terminal, and a plurality of gates;
    a second power supply;
    a MOS transistor of a second conductivity type having one terminal connected to said output terminal, the other terminal connected to said second power supply, and a plurality of gates;
    a plurality of first inverter circuits, arranged in correspondence with said plurality of gates of said MOS transistor of the first conductivity type and respectively connected to said plurality of gates of said MOS transistor of the first conductivity type, for independently driving said plurality of gates of said MOS transistor of the first conductivity type in response to input signals input to said input terminal; and
    a plurality of second inverter circuits, arranged in correspondence with said plurality of gates of said MOS transistor of the second conductivity type and respectively connected to said plurality of gates of said MOS transistor of the second conductivity type, for independently driving said plurality of gates of said MOS transistor of the second conductivity type in response to the input signals input to said input terminal.

2. A circuit according to claim 1, wherein said plurality of first inverter circuits and said plurality of second inverter circuits sequentially drive said plurality of gates of said MOS transistor of the first conductivity type and said plurality of gates of said MOS transistor of the second conductivity type, respectively.

3. A circuit according to claim 1, wherein said plurality of first inverter circuits have transconductances different from each other, and the transconductances are set such that fall times of output signals output from said output terminal in response to the input signals are different from each other.

4. A circuit according to claim 3, wherein each of said plurality of first inverter circuits has a MOS transistor, and each of the transconductances is set by one of a channel width and a channel length of said MOS transistor.

5. A circuit according to claim 3, wherein the transconductances are set such that fall times of output signals output from said output terminal in response to the input signals are sequentially prolonged.

6. A circuit according to claim 1, wherein said plurality of second inverter circuits have transconductances different from each other, and the transconductances are set such that rise times of output signals output from said output terminal in response to the input signals are different from each other.

7. A circuit according to claim 6, wherein each of said plurality of second inverter circuits has a MOS transistor, and each of the transconductances is set by one of a channel width and a channel length of said MOS transistor.

8. A circuit according to claim 6, wherein the transconductances are set such that rise times of output signals output from said output terminal in response to the input signal are sequentially prolonged.

9. A circuit according to claim 1, wherein said gates consist of one selected from the group consisting of a metal and polysilicon.

10. An output circuit having first to third input terminals and an output terminal, comprising:
    a first power supply;
    a MOS transistor of a first conductivity type having one terminal connected to said first power supply, the other terminal connected to said output terminal, and a plurality of gates;
    a second power supply;
    a MOS transistor of a second conductivity type having one terminal connected to said output terminal, the other terminal connected to said second power supply, and a plurality of gates;
    a plurality of first gate circuits, arranged in correspondence with said plurality of gates of said MOS transistor of the first conductivity type and respectively connected to said plurality of gates of said MOS transistor of the first conductivity type, for independently driving said plurality of gates of said MOS transistor of the first conductivity type in response to a first input signal input to said first input terminal and a second input signal input to said second input terminal; and
    a plurality of second gate circuits, arranged in correspondence with said plurality of gates of said MOS transistor of the second conductivity type and respectively connected to said plurality of gates of said MOS transistor of the second conductivity type, for independently driving said plurality of gates of said MOS transistor of the second conductivity type in response to the first input signal input to said first input terminal and a third input signal input to said third input terminal and serving as an inverted signal of the second input signal.

11. A circuit according to claim 10, wherein said plurality of first gate circuits and said plurality of second gate circuits sequentially drive said plurality of gates of said MOS transistor of the first conductivity type and said plurality of gates of said MOS transistor of the second conductivity type, respectively.

12. A circuit according to claim 10, wherein said plurality of first gate circuits are respectively constituted by NAND circuits having transconductances different from each other, and the transconductances are set such that fall times of output signals output from said output terminal in response to the first and second input signals are different from each other.

13. A circuit according to claim 12, wherein each of said plurality of NAND circuits has a MOS transistor, and each of the transconductances is set by one of a channel width and a channel length of said MOS transistor.

14. A circuit according to claim 13, wherein the transconductances are set such that fall times of output signals output from said output terminal in response to the input signals are sequentially prolonged.

15. A circuit according to claim 10, wherein said plurality of second gate circuits are respectively constituted by NOR circuits, having transconductances different from each other, and the transconductances are set such that rise times of output signals output from said output terminal in response to the first and third input signals are different from each other.

16. A circuit according to claim 15, wherein each of said plurality of NOR circuits has a MOS transistor, and each of the transconductances is set by one of a channel width and a channel length of said MOS transistors.

17. A circuit according to claim 15, wherein the transconductances are set such that rise times of output signals output from said output terminals in response to the input signals are sequentially prolonged.

18. A circuit according to claim 10, wherein said gates consist of one selected from the group consisting of a metal and polysilicon.

* * * * *